(12) United States Patent
Ishida et al.

(10) Patent No.: US 9,608,095 B2
(45) Date of Patent: Mar. 28, 2017

(54) THERMOELECTRIC CONVERSION ELEMENT AND MANUFACTURING METHOD FOR THE SAME

(71) Applicant: NEC Corporation, Tokyo (JP)

(72) Inventors: Masahiko Ishida, Tokyo (JP); Akihiro Kirihara, Tokyo (JP); Shigeru Koumoto, Tokyo (JP)

(73) Assignee: NEC Corporation, Tokyo (JP)

( * ) Notice: Subject to any disclaimer, the term of this patent is extended or adjusted under 35 U.S.C. 154(b) by 9 days.

(21) Appl. No.: 14/650,466

(22) PCT Filed: Dec. 16, 2013

(86) PCT No.: PCT/JP2013/083646
§ 371 (c)(1),
(2) Date: Jun. 8, 2015

(87) PCT Pub. No.: WO2014/098041
PCT Pub. Date: Jun. 26, 2014

(65) Prior Publication Data
US 2015/0333247 A1 Nov. 19, 2015

(30) Foreign Application Priority Data
Dec. 19, 2012 (JP) .................. 2012-277353

(51) Int. Cl.
*H01L 37/00* (2006.01)
*H01L 43/14* (2006.01)
(Continued)

(52) U.S. Cl.
CPC .... *H01L 29/66984* (2013.01); *H01L 29/1606* (2013.01); *H01L 37/00* (2013.01); *H01L 43/04* (2013.01); *H01L 43/14* (2013.01)

(58) Field of Classification Search
CPC ....... H01L 37/00; H01L 37/025; H01L 37/04; H01L 35/12; H01L 35/22; H01L 35/26;
(Continued)

(56) References Cited

U.S. PATENT DOCUMENTS

2012/0279541 A1   11/2012   Choi et al.

FOREIGN PATENT DOCUMENTS

JP    2009-130070 A    6/2009
JP    2011-249746 A    12/2011
(Continued)

OTHER PUBLICATIONS

Vera_Marun, et al "Non-linear spin Seebeck effect due to spin-charge interaction in graphene," arXiV, preprint v5, Sep. 2011, pp. 1-7.*
Patra, et al "Dynamic spin injection into chemical vapor deposited graphene," Applied Physics Letters, Oct. 2012, 101, 162407, pp. 1-4.*
Niimi, et al "Extrinsic Spin Hall Effect INduced by Iridium Impurities in Copper" Physical Review Letters, Mar. 2011, pp. 126601-1 to 126601-4.*
(Continued)

*Primary Examiner* — Marla D McConnell
(74) *Attorney, Agent, or Firm* — Wilmer Cutler Pickering Hale and Dorr LLP

(57) ABSTRACT

Concerning a thermoelectric conversion element, it is desired to provide a new spin current to charge current conversion material. A thermoelectric conversion element includes a magnetic layer possessing in-plane magnetization, and an electromotive layer magnetically coupled to the magnetic layer. The electromotive layer is formed of a carbon material, possesses anisotropy of electric conductivity, and further includes an additive.

4 Claims, 8 Drawing Sheets

(51) Int. Cl.
*H01L 43/04* (2006.01)
*H01L 29/66* (2006.01)
*H01L 29/16* (2006.01)

(58) Field of Classification Search
CPC ........... H01L 29/1606; H01L 29/66984; H01L 43/04; H01L 43/14
See application file for complete search history.

(56) References Cited

FOREIGN PATENT DOCUMENTS

| JP | 2012-235092 A | 11/2012 |
|----|---------------|---------|
| WO | WO-2012/161336 A1 | 11/2012 |
| WO | WO-2012/169509 A1 | 12/2012 |

OTHER PUBLICATIONS

International Search Report, Corresponding to PCT/JP2013/083646, dated Jan. 28, 2014, 1 page.
M.S. Dresselhaus et al., "Intercalation Compounds of Graphite," Advances in Physics, vol. 51, No. 1 (Jan.-Feb. 2002), 186 pages.
H. Hiura et al., "Liquid Phase Growth of Graphene on Silicon Carbide," Carbon 50 (2012), pp. 5076-5084, 9 pages.
Uchida et al., "Observation of Longitudinal Spin-Seebeck Effect in Magnetic Insulators," Applied Physics Letters, Oct. 25, 2010, vol. 97, No. 17, p. 172505, 4 pages.
Uchida et al., "SpinSeebeck Insulator," Nature Materials, Letters Published Online: Sep. 26, 2010/DOI:10.1038/NMAT28656, vol. 9, Nov. 2010, pp. 894-897, 4 pages.

\* cited by examiner

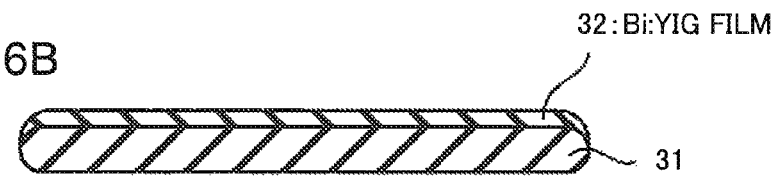
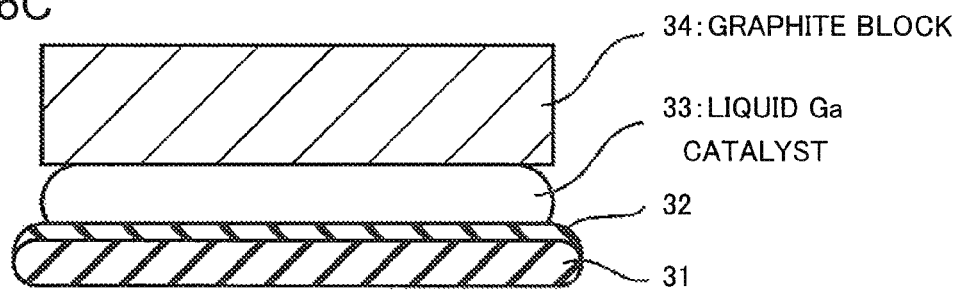
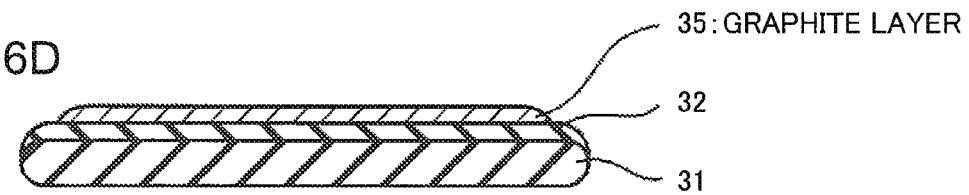
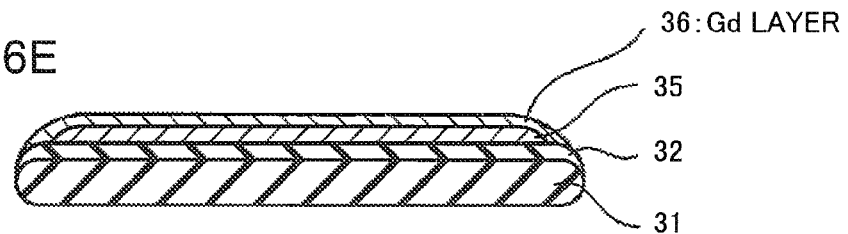
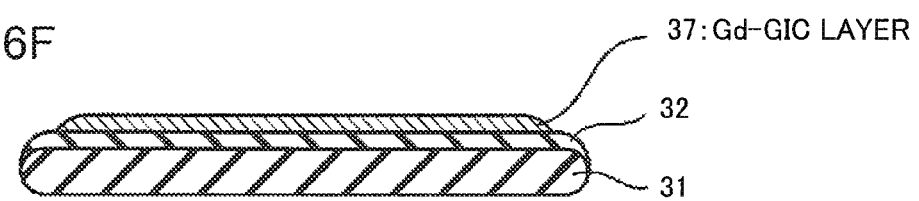

THERMOELECTRIC CONVERSION ELEMENT AND MANUFACTURING METHOD FOR THE SAME

CROSS-REFERENCE TO RELATED APPLICATIONS

The present application is a national stage application of International Application No. PCT/JP2013/083646 entitled "Thermelectric Conversion Element and Manufacturing Method for The Same," filed on Dec. 16, 2013 which claims the benefit of priority from Japanese Patent Application No. JP20132-277353, filed on Dec. 19, 2012, the disclosures of which are Incorporated herein in their entirety by reference thereto.

TECHNICAL FIELD

The present invention relates to a thermoelectric conversion element based on the spin-Seebeck effect and the inverse spin-Hall effect, and a manufacturing method for the same.

BACKGROUND ART

In recent years, an electronic technique called "spintronics" has been brought into the spotlight. While the conventional electronics uses "electric charge" that is one property of an electron, the spintronics, in addition to this, also actively uses "spin" that is another property of an electron. Particularly, "spin-current" that is flow of spin angular momentum is an important concept. Since energy dissipation of spin current is small, there is a possibility that using spin energy can accomplish highly efficient information transfer. Accordingly, generation, detection, and control of spin current are important themes.

For example, there is known a phenomenon that when an electric current flows, spin current is generated. This is called the "spin-Hall effect". As a phenomenon opposite thereto, it is known that when spin current flows, electromotive force is generated. This is called the "inverse spin-Hall effect". By using the inverse spin-Hall effect, spin current can be detected. The spin-Hall effect and the inverse spin-Hall effect are significantly appeared in a material (e.g., Pt or Pd) whose "spin orbit coupling" is strong.

By recent research, existence of "spin-Seebeck effect" in a magnetic material has been made clear. The spin-Seebeck effect is a phenomenon that when a temperature gradient is applied to a magnetic material, spin current is induced in a direction parallel to the temperature gradient (for example, refer to the patent literature 1 and the patent literature 2). In other words, by the spin-Seebeck effect, heat is converted into spin current (thermal spin-current conversion). Patent literature 1 reports the spin-Seebeck effect in a NiFe film that is a ferromagnetic metal. Non-patent literatures 1 and 2 report the spin-Seebeck effect at an interface between an electromotive film and a magnetic insulator such as yttrium iron garnet (YIG, $Y_3Fe_5O_{12}$).

Spin current induced by a temperature gradient can be converted into an electric field (electric current, voltage) by using the above-mentioned inverse spin-Hall effect. Namely, using both of the spin-Seebeck effect and the inverse spin-Hall effect enables "thermoelectric conversion" that converts a temperature gradient into electricity.

FIG. 1 illustrates a configuration of a thermoelectric conversion element disclosed in the patent literature 1 and using the spin-Seebeck effect. On a sapphire substrate 101, a thermal spin-current conversion unit 102 is formed. The thermal spin-current conversion unit 102 has a layered structure of a Ta film 103, a PdPtMn film 104, and a NiFe film 105. The NiFe film 105 is a magnetic film having magnetization in an in-plane direction. Further, on the NiFe film 105, a Pt film 106 is formed as an electromotive film. Both ends of the Pt film 106 are connected to terminals 107-1 and 107-2, respectively.

In the thus-configured thermoelectric conversion element, the NiFe film 105 plays a role of generating spin current from a temperature gradient by the spin-Seebeck effect, and the Pt film 106 plays a role, which is a role as a spin current to electric current conversion material, of generating electromotive force from the spin current by the inverse spin-Hall effect. Concretely, when a temperature gradient is applied in the in-plane direction of the NiFe film 105, the spin current is generated in a direction parallel to the temperature gradient by the spin-Seebeck effect. Then, the spin current flows from the NiFe film 105 into the Pt film 106. Alternatively, the spin current flows out of the Pt film 106 to the NiFe film 105. In the Pt film 106, by the inverse spin-Hall effect, the electromotive force is generated in a direction perpendicular to the spin current direction and the NiFe magnetization direction. The electromotive force can be brought out from the terminals 107-1 and 107-2 provided at the both ends of the Pt film 106.

FIG. 2 illustrates a configuration of a longitudinal thermoelectric conversion element disclosed in Patent Literature 2. As illustrated in FIG. 2, an electromotive layer 120 is stacked on a magnetic layer 110. In the case of the longitudinal thermoelectric conversion element, a temperature gradient is applied in the stacking direction.

When a temperature gradient is applied in the stacking direction, thermal spin current is generated in the same direction, i.e., from a high temperature side to a low temperature side. Further, at an interface between the magnetic layer 110 and the electromotive layer 120, the thermal spin current undergoes a process called spin injection, and generates pure spin current into the electromotive film. The spin injection is a phenomenon in which a spin that performs precession adjacent to the interface around an axis of a magnetization direction interacts with a conduction electron that exists in the electromotive film and that does not have a spin, and gives spin angular momentum to the conduction electron, or receives spin angular momentum from the conduction electron. As a result, in the electromotive layer 120, near the spin injection interface, "pure spin current" by conduction electrons having spins is generated. In this pure spin current, an up-spin and a down-spin current in directions opposite to each other, and for this reason, an electric charge does not move in the direction of the pure spin current, and only momentum of spins flows.

When the electromotive layer 120 is formed of a material having large spin orbit coupling, electromotive force is generated in the direction perpendicular to the spin current direction and to the magnetization direction by the inverse spin-Hall effect.

In the spin current thermoelectric conversion element as described above, magnitude of generated electromotive force is obtained by multiplying amount of spin current generated in the magnetic layer by spin current injection efficiency (injection efficiency of spin current at the interface with the electromotive layer) and spin current to charge current conversion efficiency (efficiency at which spin current is converted into electromotive force by the inverse spin-Hall effect in the electromotive layer). Accordingly, three indexes of amount of spin current itself, spin current injection efficiency, and spin current to charge current conversion efficiency need to be increased at the same time for obtaining a thermoelectric conversion element having larger output. Improvement in spin current to charge current conversion efficiency in the electromotive layer among them is an important theme for other spintronics elements as well.

A material of the electromotive layer has both an electrical conductivity and the spin-Hall conductivity. A dimensionless index representing the spin-Hall conductivity and an electrical conductivity is called "spin-Hall angle". The spin-Hall angle is used as an index for magnitude of the spin-Hall effect.

In typical experiments, pure Pt having the large spin-Hall angle is often used as the electromotive layer. Although the spin-Hall angles of Au, Ag, Cu and the like as similar pure noble metals fall short of that of Pt, there is a case where the spin-Hall angle larger than that of pure Pt can be obtained by introducing a minute quantity of Fe introduced as impurities into Au, or adding Ir to Cu, for example.

CITATION LIST

Patent Literature

[PTL 1] Japanese laid-open patent publication No. 2009-130070
[PLT 2] Japanese laid-open patent publication No. 2011-249746

Non Patent Literature

[NPL 1] Uchida et al., "SpinSeebeck insulator", Nature Materials, 2010, vol. 9, p. 894.
[NPL 2] Uchida et al., "Observation of longitudinal spin-Seebeck effect in magnetic insulators", Applied Physics Letters, 2010, vol. 97, p 172505.

SUMMARY OF INVENTION

Technical Problem

The previous search for a spin current to charge current conversion material used for a spintronics element is focused mainly on increase in the spin-Hall angle. Meanwhile, when a spin current to charge current conversion material is used for an actual element, there are problems to be solved other than magnitude of the spin-Hall angle. One is a problem of manufacturing cost. A material having the large spin-Hall angle in a simple substance is an expensive material such as Pt and Pd. For this reason, it is necessary to search for a cheaper spin current to charge current conversion material.

One object of the present invention is to provide a new spin current to charge current converting material in relation to a thermoelectric conversion element.

Solution to Problem

In one aspect of the present invention, a thermoelectric conversion element includes a magnetic layer possessing in-plane magnetization, and an electromotive layer magnetically coupled to the magnetic layer. The electromotive layer is formed of a carbon material, possesses anisotropy of electric conductivity, and further includes an additive.

Advantageous Effects of Invention

According to the present invention, concerning a thermoelectric conversion element, a new spin current to charge current conversion material is provided.

BRIEF DESCRIPTION OF DRAWINGS

FIG. 6A is a sectional view illustrating a first example.
FIG. 6B is a sectional view illustrating the first example.
FIG. 6C is a sectional view illustrating the first example.
FIG. 6D is a sectional view illustrating the first example.
FIG. 6E is a sectional view illustrating the first example.
FIG. 6F is a sectional view illustrating the first example.

DESCRIPTION OF EMBODIMENTS

A thermoelectric conversion element according to an exemplary embodiment of the present invention, and a manufacturing method thereof will be described with reference to the accompanying drawings.

1. First Exemplary Embodiment 1-1. Entire Configuration

Figure 3:
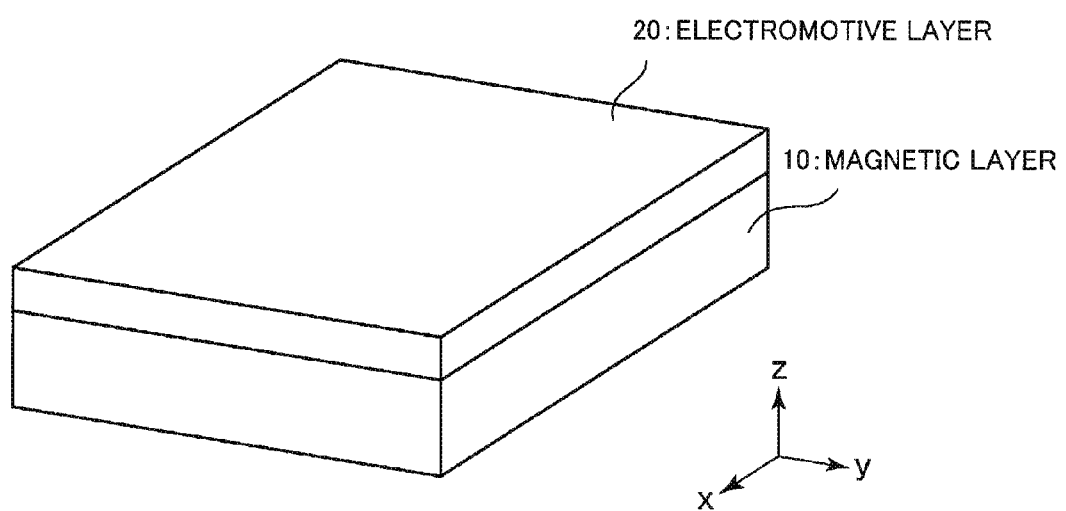
FIG. 3 is a schematic view illustrating a thermoelectric conversion element according to an exemplary embodiment of the present invention.

FIG. 3 schematically illustrates a thermoelectric conversion element according to a first exemplary embodiment of the present invention. The thermoelectric conversion element includes a magnetic layer 10 having magnetization in at least one in-plane direction, and an electromotive layer 20 magnetically coupled to the magnetic layer 10. The in-plane direction is defined by the x direction and the y direction, which are perpendicular to each other. The z direction is a vertical direction perpendicular to the in-plane direction, and is parallel to a stacking direction of the magnetic layer 10 and the electromotive layer 20.

The magnetic layer 10 is formed of a material exhibiting the spin-Seebeck effect. A material of the magnetic layer may be a ferromagnetic metal or a magnetic insulator. As the ferromagnetic metal, there are NiFe, CoFe, CoFeB, and the like. As the magnetic insulator, there are yttrium iron garnet (YIG, $Y_3Fe_5O_{12}$), YIG (Bi:YIG) into which bismuth (Bi) has been doped, YIG ($LaY_2Fe_5O_{12}$) into which lanthanum (La) has been doped, yttrium gallium iron garnet ($Y_3Fe_{5-x}$ Ga$_x$O$_{12}$), and the like. From the standpoint of suppressing thermal conduction by electrons, it is desirable to use the magnetic insulator.

As a fabrication method for the magnetic layer 10, there are a sputtering method, a metal-organic decomposition method (MOD method), a sol-gel method, an aerosol deposition method (AD method), a ferrite plating, a liquid phase epitaxy method, a solid phase epitaxy method, a vapor phase epitaxy method, a dip method, a spray method, a spin coating method, a printing method, and the like. In this case, the magnetic layer 10 is formed on some supporting body. Alternatively, a magnetic insulator fiber formed by using a crystal pulling method or the like, or a bulk body formed by a sintering method, a melting method or the like may be used as the magnetic body 10.

The electromotive layer 20 is formed of a material exhibiting the inverse spin-Hall effect (spin orbit coupling). Details of the electromotive layer 20 according to the present exemplary embodiment will be described later.

When a temperature gradient in the z direction is applied to such a thermoelectric conversion element, spin current is induced at an interface between the magnetic layer 10 and the electromotive force 20. This spin current is converted into electric electromotive force by the inverse spin-Hall effect in the electromotive layer 20 to be taken out as electric power so that "thermoelectric conversion that generates thermoelectric force from a temperature gradient" is made possible.

1-2. Electromotive Layer

In the present exemplary embodiment, as a material of the electromotive layer 20, an electrically conductive material of which basic material is carbon is used. Since carbon is a light element, and has a small effective nuclear charge, significant spin orbit coupling is not expected. Theoretically, although a possibility that the spin-Hall effect is observed in an extremely thin special carbon film such as some graphene is predicted, even if it is actually observed, a configuration is made to generate both of spin current and a charge current in a graphene sheet, and for this reason, it cannot be used in a spin current thermoelectric conversion element. Accordingly, in the present exemplary embodiment, the following idea is added.

The thermoelectric layer 20 is formed so as to have anisotropy of electric conductivity. For example, the electromotive layer 20 has a layered or tubular anisotropic configuration.

Figure 4:
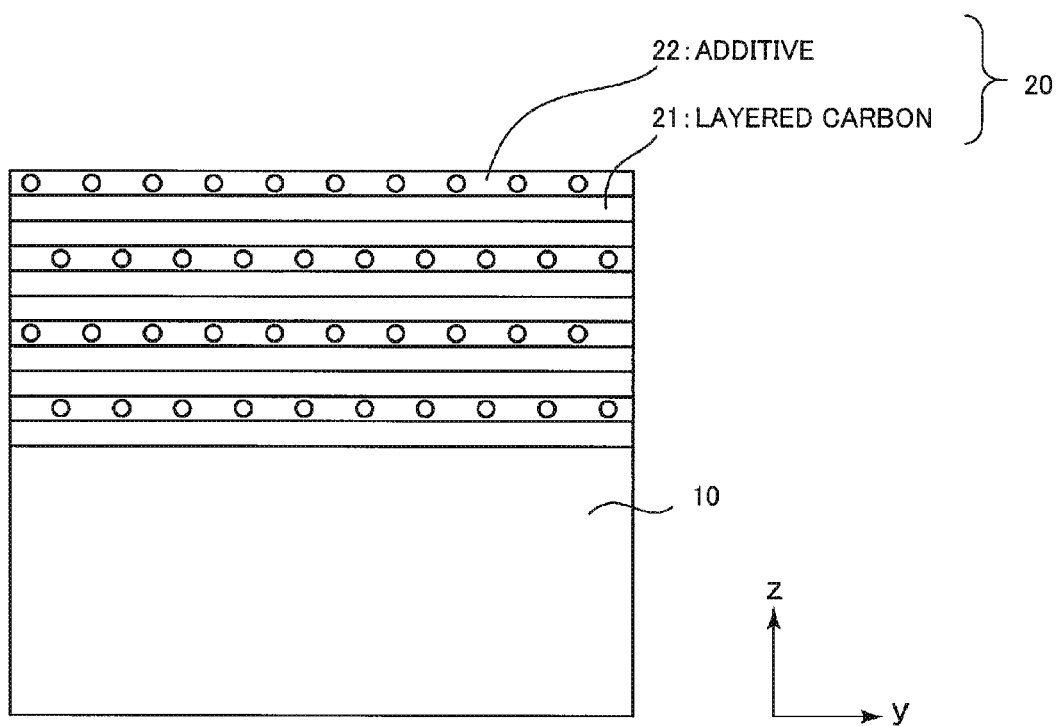
FIG. 4 is a schematic view for describing an electromotive layer of the thermoelectric conversion element according to the exemplary embodiment of the present invention.

FIG. 4 illustrates one example of a configuration of the electromotive layer 20. In the example of FIG. 4, the electromotive layer 20 has a layered anisotropic configuration. Concretely, the electromotive layer 20 has the stacking configuration of layered carbon 21. A two-dimensional sheet formed by each layered carbon 21 (carbon film) is approximately parallel to the interface between the magnetic layer 10 and the electromotive layer 20.

Further, an additive 22 is added to the carbon material of the electromotive layer 20. As illustrated in FIG. 4, the additive 22 exists in the form of molecules, ions, or the like between the two-dimensional sheets by the layered carbon 21. Namely, the layered carbon 21 and the additive 22 are accumulated in layers.

As the additive 22, for example, a material including an element that includes a d electron or an f electron at the outermost shell can be used. This additive 22 is added for causing "the spin-Hall effect having an extrinsic origin". The extrinsic spin-Hall effect is a phenomenon that when spin current is scattered by a potential singularly existing by impurities inside bulk, the scattered direction (left/right) differs by a direction (up/down) of the spin.

Figure 5:
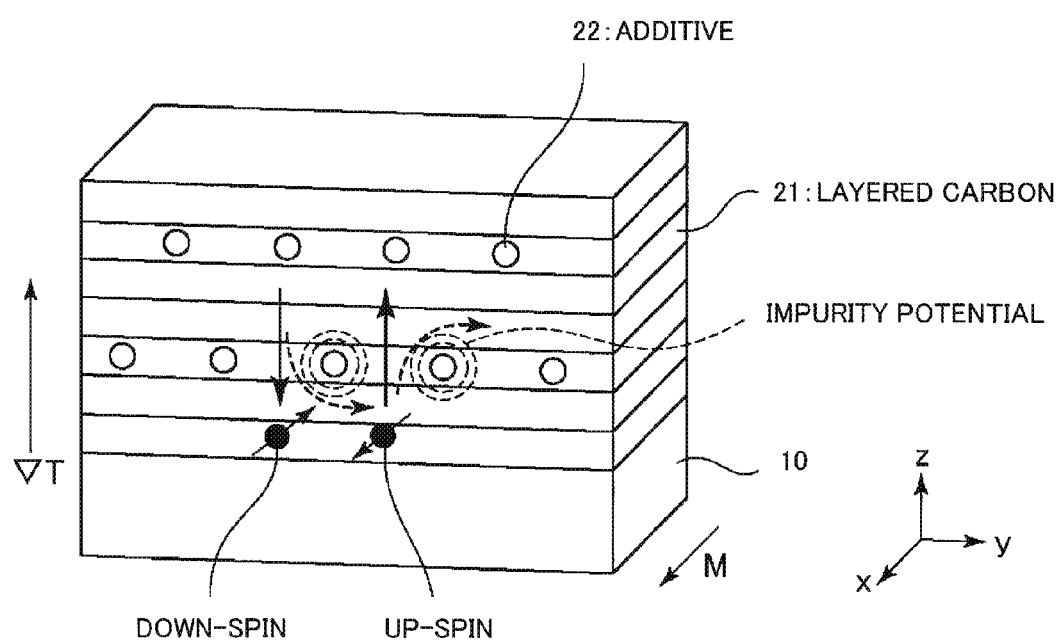
FIG. 5 is a schematic view for describing an operation of the electromotive layer of the thermoelectric conversion element according to the exemplary embodiment of the present invention.

Thermal spin current to electromotive-force conversion in the thermoelectric conversion element according to the present exemplary embodiment will be described with reference to FIG. 5. In FIG. 5, the thermoelectric conversion element includes the magnetic layer 10 having in-plane magnetization M (x direction), and the electromotive layer 20 arranged on the magnetic layer 10. The electromotive layer 20 is formed of the layered carbon 21, and further contains the additive 22.

To the thermoelectric conversion element having such a configuration, a temperature gradient directed from the magnetic layer 10 to the electromotive layer 20 is applied. In this case, in the magnetic layer 10, thermal spin current via interaction between spins is generated. Further, at the interface between the magnetic layer 10 and the electromotive layer 20, spin injection occurs so as to transfer spin angular momentum to conduction electrons of the layered carbon 21, and pure spin current is generated in the layered carbon 21. This pure spin current is generated such that an up-spin parallel to the magnetization M of the magnetic layer 10 and a down-spin antiparallel thereto coexist. The up-spin flows so as to go along the temperature gradient, and the down-spin flows so as to go up the temperature gradient.

The spin conduction electrons moving in this manner is affected by an impurity potential generated by the additive 22 when the additive 22 exists nearby. Thereby, as illustrated in FIG. 5, the movement of the spin conduction electron is changed to the lateral movement along with the additive 22 as a pivot point. As a result, a current flows in the direction perpendicular to the pure spin current, i.e., the inverse spin-Hall effect is exhibited.

The spin-Hall conductivity generated at this time takes an extremely large value reflecting a large in-plane electric conductivity of the layered carbon 21. Meanwhile, since electric conductivity of the layered carbon 21 in the case of defining the spin-Hall angle reflects a small inter-layer electric conductivity, the large spin-Hall angle can be obtained as a result.

As described above, according to the present exemplary embodiment, the additive 22 is added to the carbon material so that the spin-Hall effect having an external origin can be obtained. Further, a new mechanism that has anisotropy of electric conductivity is combined so that the large spin-Hall angle can be realized by a mechanism that did not exist before. As a result, conversion efficiency of spin current to charge current conversion material is improved, and consequently, conversion efficiency of the spin current thermoelectric conversion element is largely improved as well.

Figure 1:
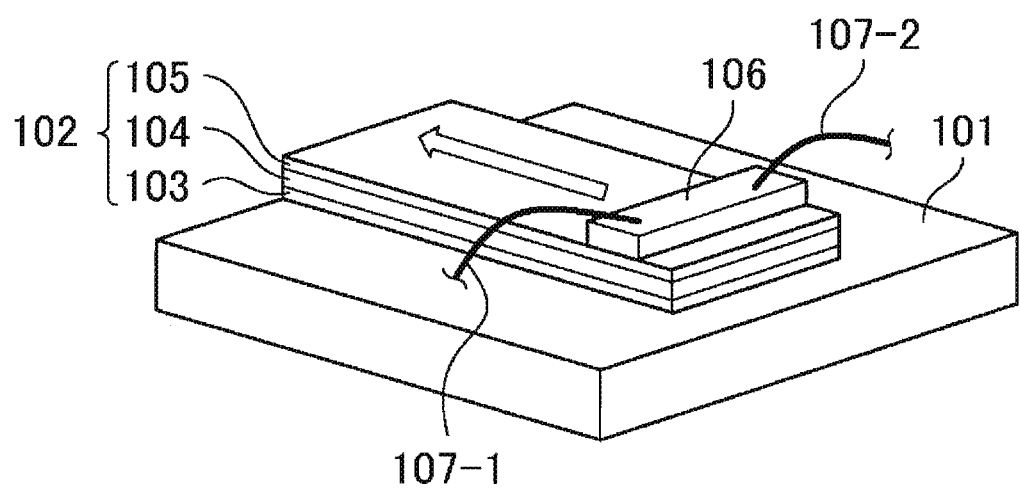
FIG. 1 is a schematic view illustrating a thermoelectric conversion element described in the Patent Literature 1.
Figure 2:
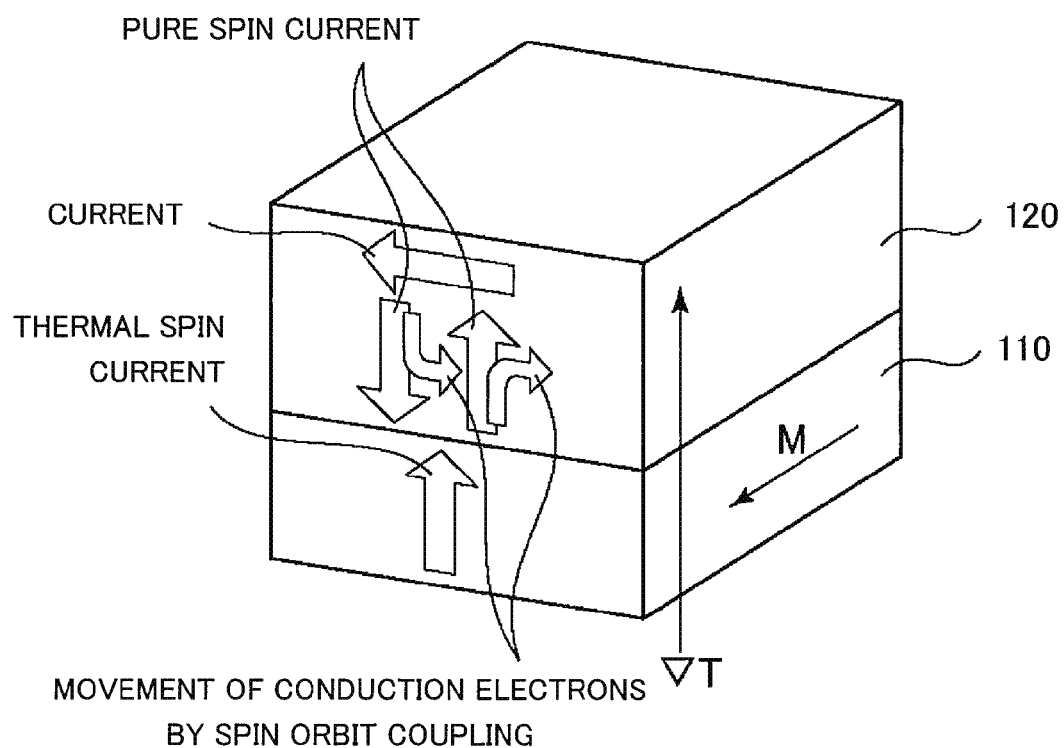
FIG. 2 is a schematic view illustrating a typical longitudinal thermoelectric conversion element.

The electromotive layer 20 according to the present exemplary embodiment can be applied to not only the longitudinal thermoelectric conversion element but also the transverse thermoelectric conversion element as illustrated in FIG. 1. Even with the transverse thermoelectric conversion element, the same advantageous effect can be obtained.

2. Second Exemplary Embodiment 2-1 Configuration

For example, as the electromotive layer 20, graphite intercalation compound (GIC) can be used. As illustrated in FIG. 4, the two-dimensional carbon sheets formed by the layered carbon 21 spread parallel to the interface between the magnetic layer 10 and the electromotive layer 20. Between these two-dimensional carbon sheets, the additive 22 exists in the form of molecules, ions, or the like at certain periodic intervals in both of the in-plane and stacking directions. As the additive 22, heavy transition metal (e.g., Sr, Ba, Y, Eu, Gd, Yb, Bi, or the like) or rare-earth metal can be used.

Since the periodic property of the additive 22 can be adjusted by a condition such as heat treatment at the time of synthesizing GIC, optimization can be made so as to obtain the larger spin-Hall angle. While this periodic property exists as a thermally stable equilibrium state, if the principle of the extrinsic spin-Hall effect is considered, an increasing effect of the spin-Hall angle can be naturally obtained even when the additive 22 does not periodically exist.

2-2. Fabrication Method

As a fabrication method for the electromotive layer 20 using a graphite intercalation compound (GIC), the following two are considered: (1) the method in which after the layered carbon 21 is first added onto the surface of the magnetic layer 10, change to the GIC is made in a liquid phase or a gas phase, and (2) the method in which the GIC synthesized in advance is added onto the magnetic layer 10 by a process such as transferring or spraying.

As a method for adding the layered carbon 21 to the surface of the magnetic layer 10, the following is considered. For example, by using generally available highly-oriented pyrolytic graphite (HOPG) or kish graphite, a flake attaching method described in the reference document 1 (K. S. Novoselov et al., "Electric Field Effect in Atomically Thin Carbon films" Science 306 (2004) pp. 666-669) or the like can be used. Alternatively, the liquid phase epitaxy disclosed in reference document 2 (H. Hiura et al., "Liquid phase growth of graphene on silicon carbide", Carbon 50(2012) pp. 5076-5084.) can be used to form a film on the surface of the magnetic layer 10, or aerosol deposition (AD) in which aerosol of a layered-carbon material such as graphite, graphene, or a carbon nanohorn is sprayed to a substrate to form a film can be used as well.

For synthesizing of the GIC, the method described in the reference document 3 (M. S. Dresselhaus et al., "Intercalation compounds of graphite" Advances in physics 51, (2002) pp. 1-186) can be used. Concretely, this is the method in which generally available highly-oriented pyrolytic graphite (HOPG) or kish graphite, or layered carbon created by the liquid phase epitaxy disclosed in the above-mentioned reference document 2 is used as a material to insert a target additive between the layers by using a gas phase transporting method, a liquid phase method, an electrochemical method, or the like.

Concerning the synthesizing of the GIC, the layered carbon material previously fixed to the surface of the magnetic layer 10 is later processed to be the GIC, and alternatively, the synthesizing can be previously made prior to the fixing to the surface of the magnetic layer 10. Namely, by the flake attaching method described in the above-mentioned reference document 1, or the AD method, the GIC itself can be directly coated as well.

In addition, in the case of using the AD method, a method in which at the same time as a material used as the additive, spraying is performed to form a film is possible, or in integrated processes subsequent to the liquid phase epitaxy of a graphen film disclosed in the reference document 2, a catalyst can be changed, and a changing-to-GIC process can be performed to create the electromotive layer 20.

Thus, as a material of the electromotive layer 20, a material cheaper than before can be used. Further, by the method simpler than before, the electromotive layer 20 can be created.

3. Third Exemplary Embodiment

The electromotive layer 20 does not necessarily need to have a stage structure adopted in a general GIC. Namely, the additive 22 is not required to make a monoatomic layer or monomolecular layer like a GIC, and may be a hybrid film made of a thicker film of one or more layers. In this regard, for the optimum amount of the additive 22, i.e., film thickness, the optimum condition can be set from the comprehensive viewpoint such as an increase effect of the spin-Hall angle and manufacturing cost, and durability and functionality of a film.

4. Fourth Exemplary Embodiment

The same advantageous effect can be obtained by using "a tubular carbon material" such as a carbon nanotube instead of the layered carbon 21. In this case, the carbon nanotube can be used in the form of Gd peapod including Gd-containing fullerene inside the tube or other form with an additive that is heavy metal including electrons of 4d and 5d orbits or 4f and 5f orbits. Further, also in the case of using the tubular carbon material, the above-described hybrid film structure can be used.

5. Various Examples 5-1. First Example

FIG. 6A to FIG. 6F are cross-sectional views for describing a first example.

As a substrate 31 on which the thermoelectric conversion element is formed, a crystalline gadolinium gallium garnet (GGG) wafer whose thickness is 700 um is used (FIG. 6A).

As the magnetic layer 10, bismuth substitution yttrium iron garnet (Bi:YIG, composition is $BiY_2Fe_5O_{12}$) is used (FIG. 6B). The Bi:YIG film 32 can be formed by a metal-organic decomposion method (MOD method). As a solution, an MOD solution produced by Kojundo Chemical Laboratory Co., Ltd. is used. In this solution, a metal material having the proper mole ratio (Bi:Y:Fe=1:2:5) is dissolved in acetate ester at a concentration of 3% in a carboxylated state. This solution is applied on the GGG substrate 31 by spin-coated film (rotation speed 1000 rpm, 30 s rotation). After drying for 5 minutes by a hot plate of 150° C., pre-annealing is performed for 5 minutes at 500° C., and lastly, main annealing is performed for 14 hours in an electric furnace at a high temperature of 700° C. under atmospheric conditions. Thereby, on the GGG substrate 31, the crystalline Bi:YIG film 32 having a thickness of approximately 65 nm was formed.

Subsequently, at a first process in formation of the electromotive layer 20, a graphite film is created by applying the liquid phase epitaxy that is described in the above-mentioned reference document 2 and that uses liquid gallium as a catalyst. Concretely, a gallium catalyst 33 (liquid Ga catalyst) that is low-melting-point metal is sandwiched by the Bi:YIG coat 32 and a graphite block 34 that becomes a supply source for carbon (FIG. 6C). In this state, introduction into a vacuum chamber of about $10^{-3}$ Pa is performed, heating is performed at a speed of about 100 degrees per minute to keep a heated state at a temperature of about 900 degrees for 5 minutes, and cooling to a room temperature is performed at a speed of about 50 degrees per minute.

As a result, a graphite layer 35 of about 5 layers can be confirmed by evaluating light transmittance change or the like (FIG. 6D). A growth speed of the graphite layer 35 depends on a temperature condition and process time, and is sensitive also to a temperature gradient in a sample. While creation needs to be made under the condition that generation of a temperature difference in the Bi:YIG film 32 and the graphite block 34 in a heated state is suppressed as much as possible, the growth speed largely changes depending on a setup of experiment.

The substrate on which the graphite layer 35 was formed is once taken out to an atmosphere, the graphite block 34 and the Ga catalyst 33 are removed, and cleaning is performed. Then, introduction into a magnetron sputter deposition system is performed, and a Gd film 36 of about 1 nm is deposited (FIG. 6E).

Further, heat treatment is performed on the entire substrate at a temperature of 700 degrees for two hours in a vacuum of $10^{-3}$ Pa so that a Gd-GIC layer 37 is created (FIG. 6F).

Lastly, a Ti/Au pad for contact is deposited, and then, dicing is made into a strip shape of 2×8 mm so that an element for evaluation can be created.

The thermoelectric conversion ability becomes apparent by applying an external magnetic field of about ±100 mT in a state where a temperature difference of about 10K is applied in the vertical direction to the entire sample including the substrate, and by measuring change in an open-circuit voltage between the pads. As a result of the measurement, if a manner in which the output voltage is reversed in accordance with a reversal of the external magnetic field, and a manner in which the output voltage is reversed in accordance with a reversal of the temperature gradient can be measured, it can be determined that the spin-Seebeck effect has been observed.

In the present example, while the vacuum process is used, a Gd-GIC of an ideal structure is created so that a spin current thermoelectric conversion element with conversion efficiency sufficiently equivalent to that of Pt can be created only by adding a small quantity of impurities to carbon whose cost is greatly lower than that of Pt.

5-2. Second Example

In the second example, as a carbon material for creating the electromotive layer 20, a carbon nanohorn (CNH) is used. The CNH can include various metal and molecules therein by a liquid phase process.

Figure 7A:
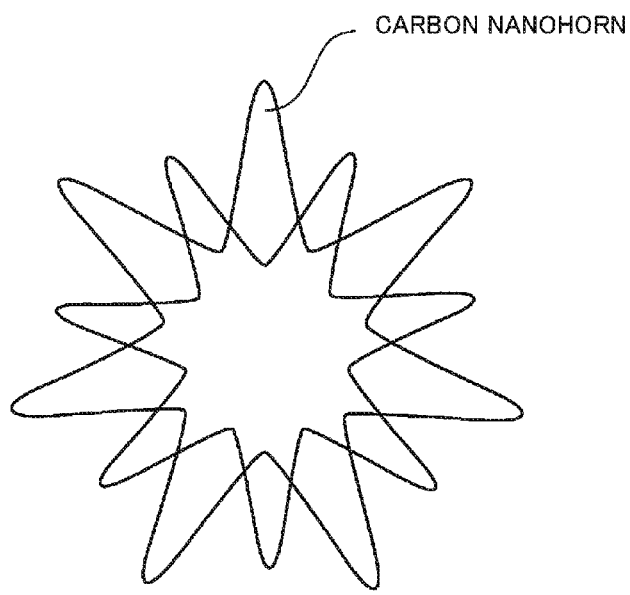
FIG. 7A is a conceptual drawing for describing a second example.

The high-purity CNH to be used produced by NEC Corporation is a homogeneous powder carbon material in which the diameters are about 100 nm and of good uniformity, and has a structure covered with tetrahedron-formed innumerable protrusions as illustrated in FIG. 7A. The surface of the protrusion is formed by a single layer of or plural layers of graphite sheets, and its inside is almost closed.

Figure 7B:
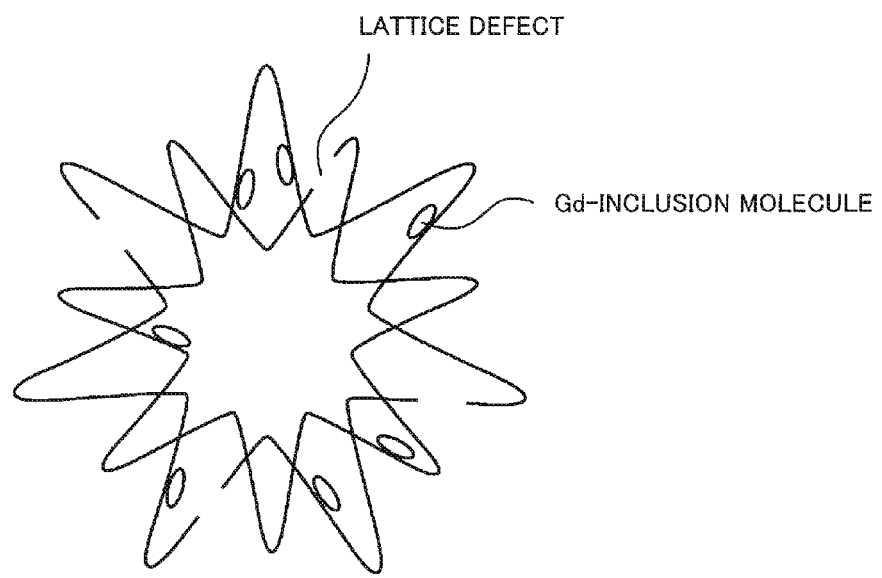
FIG. 7B is a conceptual drawing for describing the second example.

In this example, the Gd-inclusion CNH is synthesized in accordance with the method described in the reference document 4 (A. Hashimoto et al., "Selective deposition of a gadolinium (III) cluster in a hole opening of single-wall carbon nanohorn", Proceedings of the National Academy of Sciences 101 (2004) pp. 8527-8530.). First, to form lattice defects on the CNH surface (refer to FIG. 7B), heat treatment is performed on the CNH of 100 mg at a temperature of 580 degrees in an atmosphere of oxygen of 0.1 MPa for 10 minutes. Next, gadolinium triacetate tetrahydrate of 100 ml is dissolved in methanol of 40 ml that is a poor solvent. Further, the CNH is added, and a 10 s ultrasonic dispersion process is performed, and then, stabilization is performed in the course of agitation performed at a room temperature for 24 hours. This solvent is filtered so that the Gd-CNH can be obtained at a yield equal to or higher than 90%.

Using this Gd-CNH, the aerosol deposition (AD) method was performed so that a thermoelectric conversion element was created as follows.

Figure 8A:
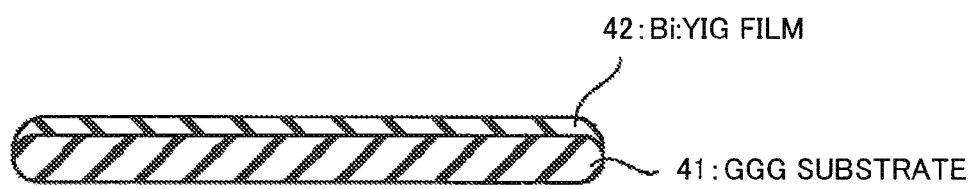
FIG. 8A is a sectional view illustrating the second example.

First, as illustrated in FIG. 8A, on a GGG substrate 41, a Bi:YIG film 42 was formed. A forming method for the GGG substrate 41 and the Bi:YIG film 42 is the same as that in the case of the first example.

Figure 8B:
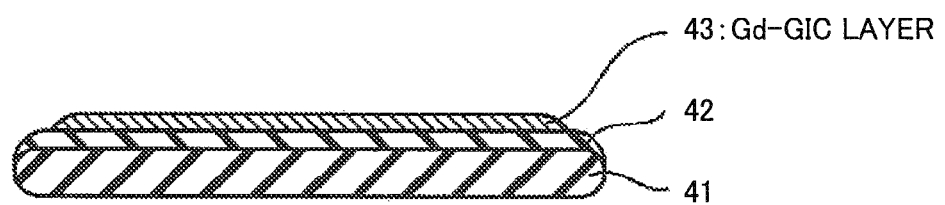
FIG. 8B is a sectional view illustrating the second example.

Next, as illustrated in FIG. 8B, on the Bi:YIG film 42, a Gd-GIC film 43 is formed. Concretely, an aerosol generation container is filled with the Gd-inclusion CNH, and the substrate is fixed to a holder in a deposition chamber. Next, in this state, pressure in the deposition chamber is decreased to 100 Pa by a rotary pump so that pressure difference between the deposition chamber and the aerosol generation container is generated. Thereby, fine particles of Bi:YIG are pulled into the inside of the deposition chamber to be sprayed to the polymide substrate. The sprayed fine particles collide with the substrate at a speed of about 300 m/s, and are broken and recombined by the collision energy at this time so that the Gd-inclusion CNH film is deposited. At this time, two-dimensionally scanning the substrate surface enables the uniform Gd-inclusion CNH film having a film thickness of 100 nm to be formed on the substrate. At this time, the CNH on the substrate loses its almost spherical external shape and is deposited to form a structure in which the carbon sheet is almost parallel with the substrate surface.

According to the present example, it becomes possible to create a spin current thermoelectric conversion element even by using a manufacturing process that does not use high vacuum.

The Bi:YIG film 42 can be created even by using the AD method, instead of the Bi:YIG film 42 created by the MOD method. In this case, manufacturing processes can be implemented in the same apparatus in an integrated manner, and manufacturing cost can be more decreased.

5-3. Third Example

In the third example, a spin current thermoelectric conversion element is created using cheaper powder graphite, instead of the relatively expensive CNH used in the second example.

The magnetic layer and the substrate are the same as those in the first and second examples. The powder graphite is a generally purchasable material, and in experiment, the powder graphite having an average diameter of about 200 nm can be used. For the powder graphite, together with powder Gd, heat treatment is performed in vacuum at a temperature of 1100 degrees for 24 hours, and then, cleaning is performed by dilute hydrochloric acid to remove extra Gd so that a powder Gd-GIC sample can be created. By using this powder Gd-GIC as a precursor material, the electromotive layer 20 having a thickness of about 100 nm is created on the Bi:YIG layer by the AD method.

Compared with an element using a Pt film, a spin current thermoelectric conversion element can be created at lower cost by using a manufacturing process that does not use high vacuum.

5-4. Fourth Example

In a fourth example, a carbon nanotube (CNT) is used as a carbon material for creating the electromotive layer 20.

As the CNT, a single-layer CNT (SWNT) created by the super-growth method is used to create a SWNT floating solution by the following procedure. First, heat treatment is performed on the SWNT in an atmosphere of a temperature of 400 degrees for 60 minutes. The SWNT of 0.1 mg is scaled, and is put into dichlorobenzene of 10 ml. An ultrasonic mixing head made of Ti is placed in the liquid to perform mixing for 10 minutes. Suspension solution created by the mixing is subjected to centrifugation of 3000 RPM for one minute using a centrifuge having a rotational radius of about 10 cm and a tube angle of 45 degrees, and then, its supernatant liquid is used as the SNWT suspension solution.

As the substrate, the Bi:YIG substrate created on a glass substrate of 2 inches by the AD method described in the second example is used. When the substrate is fixed to a wafer chuck of a spin coater, the substrate is continuously rotated at a rate of 3000 RPM, the SWNT suspension solution of 5 ml is continuously dropped by 100 ul at a time interval of 10 seconds, and spin coating is performed the total number of 50 times so that the SWNT-attached Bi:YIG substrate is obtained.

Next, gadolinium triacetate tetrahydrate of 100 ml is dissolved in methanol of 40 ml that is a poor solvent, the CNH is added to perform a 10 s ultrasonic mixing process, and then, stabilization is performed by stirring at a room temperature for 24 hours. With this solution, the SWNT-attached Bi:YIG substrate is immersed for 24 hours. Thereby, it is possible to create a spin current thermoelectric conversion element substrate including the Gd-inclusion SWNT as the electromotive layer.

The SWNT on the substrate is fixed to the substrate in a state where the SWNT is elongated radially from the substrate center. Namely, the SWNT is oriented, thereby electric power can be brought out more effectively by cutting in parallel to the direction of the orientation of the SWNT when dicing of the element is performed.

According to the present example, using the oriented film of the SWNT that has significantly large anisotropy of electric conduction enables creation of a spin current thermoelectric conversion element including the electromotive layer that realizes the larger spin-Hall angle.

Further, the present example is simple and sufficient cost suppression can be achieved, since heat treatment other than heat treatment of the SWNT material is not performed, and a vacuum process is not performed.

As described above, the exemplary embodiments of the present invention are described by reference to the drawings. However, the present invention is not limited to the above-described exemplary embodiments, and can be appropriately changed by a person skilled in the art without departing from the essence. For example, arbitrary combination of the above-described exemplary embodiments within no contradiction can form an exemplary embodiment of the present invention.

A part of or all of the above-described embodiments can be described as in the following Supplementary Notes, but are not limited to the following.

(Supplementary Note 1) A thermoelectric conversion element including: a magnetic layer possessing in-plane magnetization; and an electromotive layer magnetically coupled to the magnetic layer; wherein the electromotive layer is formed of a carbon material, possesses anisotropy of electric conductivity, and further includes an additive.

(Supplementary Note 2) The thermoelectric conversion element according to the Supplementary Note 1, wherein the electromotive layer is a graphite intercalation compound.

(Supplementary Note 3) The thermoelectric conversion element according to the Supplementary Note 1, wherein in the electromotive layer, the carbon material and the additive are deposited in layers.

(Supplementary Note 4) The thermoelectric conversion element according to any one of the Supplementary Notes 1 to 3, wherein the carbon material is a carbon nanohorn.

(Supplementary Note 5) The thermoelectric conversion element according to any one of the Supplementary Notes 1 to 3, wherein the carbon material is a tubular carbon material.

(Supplementary Note 6) The thermoelectric conversion element according to the Supplementary Note 5, wherein the tubular carbon material forms an oriented film.

(Supplementary Note 7) The thermoelectric conversion element according to any one of the Supplementary Notes 1 to 6, wherein the additive includes an element including a d electron or an f electron at an outermost shell.

(Supplementary Note 8) A manufacturing method for a thermoelectric conversion element, including the steps of: forming a magnetic layer possessing in-plane magnetization; and forming an electromotive layer magnetically coupled to the magnetic layer; wherein the electromotive layer is formed of a carbon material, possesses anisotropy of electric conductivity, and further includes an additive.

The present application claims priority based on Japanese patent application No. 2012-277353 filed on Dec. 19, 2012, and the disclosed contents in Japanese patent application No. 2012-277353 are incorporated in the present application by reference.

The invention claimed is:

1. A thermoelectric conversion element comprising:
a magnetic layer possessing in-plane magnetization; and
an electromotive layer magnetically coupled to the magnetic layer;
wherein the electromotive layer is formed of a carbon material, possesses anisotropy of electric conductivity, and further includes an additive,
wherein the electromotive layer is a graphite intercalation compound.

2. The thermoelectric conversion element comprising:
a magnetic layer possessing in-plane magnetization; and
an electromotive layer magnetically coupled to the magnetic layer;
wherein the electromotive layer is formed of a carbon material, possesses anisotropy of electric conductivity, and further includes an additive,
wherein the carbon material is a carbon nanohorn.

3. The thermoelectric conversion element comprising:
a magnetic layer possessing in-plane magnetization; and
an electromotive layer magnetically coupled to the magnetic layer;
wherein the electromotive layer is formed of a carbon material, possesses anisotropy of electric conductivity, and further includes an additive,
wherein the carbon material is a tubular carbon material.

4. The thermoelectric conversion element according to claim 3, wherein the tubular carbon material forms an oriented coat.

* * * * *